United States Patent [19]
Mikuni et al.

[11] Patent Number: 5,155,398
[45] Date of Patent: Oct. 13, 1992

[54] CONTROL CIRCUIT FOR HIGH POWER SWITCHING TRANSISTOR

[75] Inventors: Akira Mikuni, Tama; Koichiro Nishida, Yokohama, both of Japan; Hidefumi Hattori, Palo Alto, Calif.

[73] Assignee: Motorola, Inc., Schaumburg, Ill.

[21] Appl. No.: 631,511

[22] Filed: Dec. 21, 1990

[51] Int. Cl.$^5$ .......................................... H03K 17/687
[52] U.S. Cl. ............................. 307/571; 307/304; 307/443; 307/584
[58] Field of Search ............... 307/571, 572, 575, 584, 307/262, 304, 443

[56] References Cited
U.S. PATENT DOCUMENTS

| | | | |
|---|---|---|---|
| 4,438,356 | 3/1984 | Fleischer | 307/584 X |
| 4,642,485 | 2/1987 | Cornelissen et al. | 307/443 |
| 4,961,015 | 10/1990 | Shin et al. | 307/571 X |

FOREIGN PATENT DOCUMENTS

| | | | |
|---|---|---|---|
| 0142626 | 8/1983 | Japan | 307/571 |
| 0135013 | 6/1987 | Japan | 307/571 |
| 0166615 | 7/1987 | Japan | 307/571 |

*Primary Examiner*—Eugene R. LaRoche
*Assistant Examiner*—Son Dinh
*Attorney, Agent, or Firm*—Eugene A. Parsons

[57] ABSTRACT

A pair of series connected high power MOS transistors, each including a plurality of transistors formed on a single chip in parallel, with a control circuit including a pair of logic gates connected to different points of the control electrodes of the power transistors so that one of the power transistors is turned on in response to a control signal input only after the other power transistor is turned completely off.

10 Claims, 2 Drawing Sheets

CONTROL CIRCUIT FOR HIGH POWER SWITCHING TRANSISTOR

The present invention pertains to circuits for controlling series connected, power switching transistors and more specifically to circuits for insuring that only one transistor in a series of transistors is turned on at a time.

BACKGROUND OF THE INVENTION

In many integrated circuits utilized to provide power for power supplies, driving motors, and the like, two transistors, such as MOS transistors, are connected with the current carrying electrodes in series with a V+ supply connected at one end (one current carrying electrode), ground or the like connected at the other end (the other current carrying electrode) and a terminal at the junction of the two transistors providing an output. A control signal input terminal is connected to the control electrodes of each of the transistors ad ideally causes one transistor to turn on when the other transistor is turned off. The problem with this arrangement is that on occasion both transistors are on simultaneously. This provides a nearly direct short between the V+ supply and ground.

To eliminate this problem, the prior art connects the control signal input terminal directly to the control electrode of one of the transistors and through an inverter to the control electrode of the other transistor. In addition, passive elements such as resistors and capacitors are connected in the circuit to delay the application of the control signal to at least one of the control electrodes. The delay prevents both transistors from being switched simultaneously. In the process of determining the correct amount of delay (the value of the resistors and capacitors) so that both transistors are never turned on simultaneously, variations in estimated capacitance of the power transistors, temperature and the fabrication process itself must be taken into account. Thereby, an extra amount of margin is required in the delay, which greatly effects switching speed. Also, because the above mentioned variables have relatively fixed maximums, it is very difficult to improve switching speed in these prior art circuits.

SUMMARY OF THE INVENTION

It is an object of the present invention to provide a power switching circuit including a new and improved control circuit.

It is another object of the present invention to provide a new and improved integrated power switching circuit wherein switching time is not dependent upon variations in temperature or fabrication process.

These and other objects are realized in a high power switching circuit including a pair of switching transistors having current carrying electrodes connected in series and a pair of two input gates with an output of each connected to a different control electrode of the two transistors, one input of one of the gates being connected to receive a control signal and one input of the other gate being connected to receive an out-of-phase control signal, the other input of each of the gates being connected to the control electrode of the opposite transistor for turning on one of the switching transistors only after the other switching transistor is turned off.

The above objects and others are further realized in a method of manufacturing a power switching circuit including the steps of providing first and second switching transistors each having a control electrode and two current carrying electrodes, each of said switching transistors including a plurality of transistors formed in a single semiconductor substrate and connected in parallel to the control electrode and current carrying electrodes, the current carrying electrodes of said first and second switching transistors being connected in series; providing within each of the control electrodes of each of said switching transistors a control terminal connected to a first of said plurality of transistors and a detecting terminal connected to a second of said plurality of transistors; providing a control circuit; and connecting the control circuit to the control and detecting terminals of each of said switching transistors for turning on one of the switching transistors, in response to a control signal input, only after the other switching transistor is turned off.

BRIEF DESCRIPTION OF THE DRAWINGS

Referring to the drawings.

DESCRIPTION OF THE PREFERRED EMBODIMENT

Figure 1:
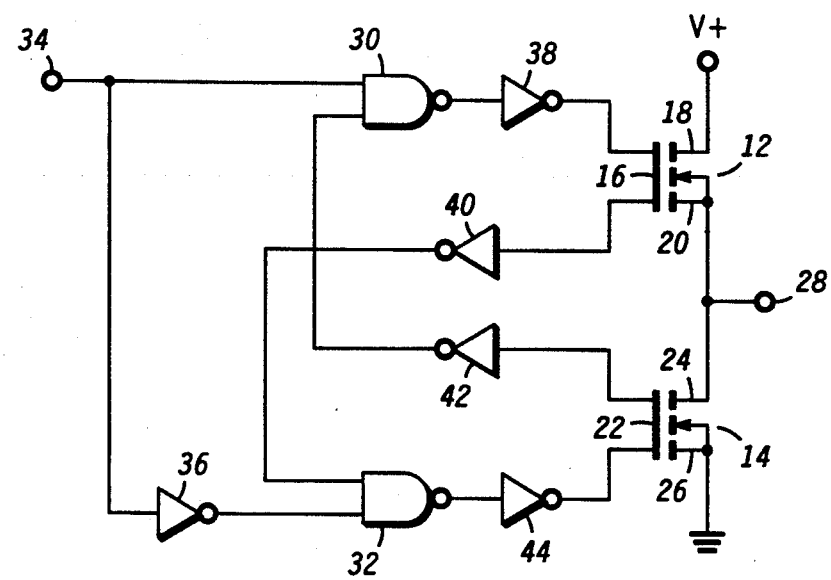
FIG. 1 is a block diagram of a high power switching circuit embodying the present invention.

FIG. 1 is a block diagram of a high power switching circuit 10 embodying the present invention. The circuit includes a pair of switching transistors 12 and 14, which in this specific embodiment are MOS high power switching transistors. Transistor 12 has a control electrode 16 and two current carrying electrodes 18 and 20. Transistor 14 has a control electrode 22 and two current carrying electrodes 24 and 26. Transistors 12 and 14 are connected in series by connecting electrode 20 of transistor 12 to electrode 24 of transistor 14. In operation electrode 18 is normally connected to a power supply V+ and electrode 26 is connected to a reference voltage such as ground. An output terminal 28 is connected to the junction of electrodes 20 and 24.

First and second two input gates, which in this embodiment are NAND gates 30 and 32, are provided. A first input of NAND gate 30 is connected directly to a control signal input terminal 34 and a first input of NAND gate 32 is connected to input terminal 34 through an inverter 36. An output terminal Of NAND gate 30 is connected through an inverter 38 to control electrode 16 of switching transistor 12. Control electrode 16 is connected through an inverter 40 to another input of NAND gate 32. An output terminal of NAND gate 32 is connected through an inverter 44 to control electrode 22 of transistor 14. Control electrode 22 is in turn connected through an inverter 42 to another input of NAND gate 30. It will of course be understood by those skilled in the art that the present system is utilized because of the convenience in integration into a single circuit but that other gates and logic arrangements could be used if desired or convenient.

In the operation of circuit 10 illustrated in FIG. 1, a control signal, such as a 50% square wave, is applied to input terminal 34. When input terminal 34 is positive a positive signal is applied to the first input of NAND gate 30 and a negative signal is applied to the first input of NAND gate 32. Since at least one input of NAND gate 32 is negative, the inverted signal supplied to control electrode 22 is negative.. Thus, a positive signal is supplied by inverter 42 to the second input of NAND gate 30 and the signal supplied to control electrode 16 is positive. When the control signal on input terminal 34 changes from positive to negative the signals all reverse and transistor 14 is switched on after the signal supplied to control electrode 16 changes to a negative signal, thereby switching transistor 12 off.

Figure 2:
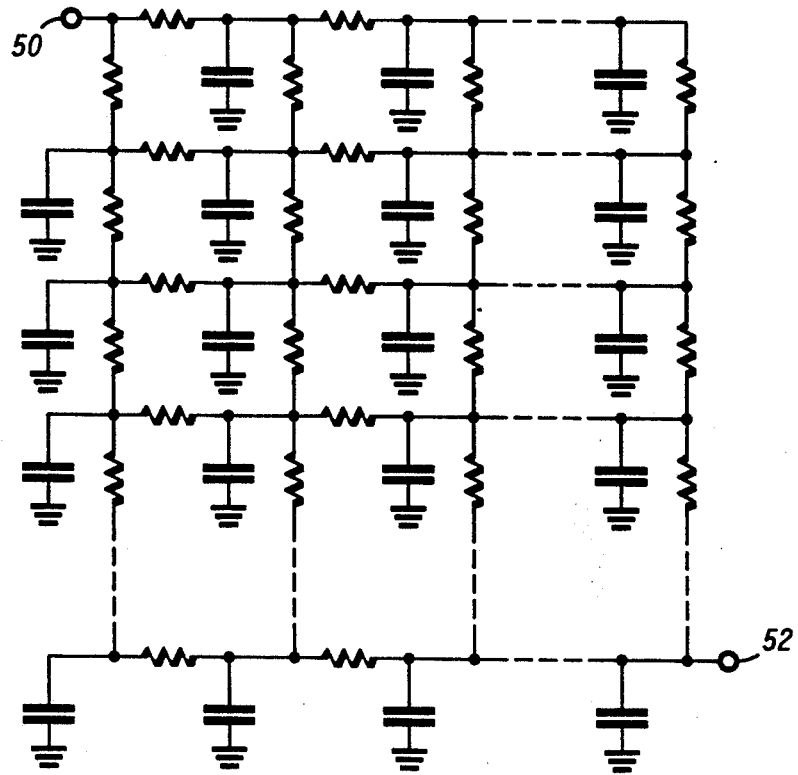
FIG. 2 is a schematic diagram of the equivalent circuit for parasitic components existing at the control electrode of an MOS transistor.

In the fabrication of high power transistors, such as MOS transistors 12 and 14, a plurality of transistors are formed in a single semiconductor substrate and connected in parallel to the control and current carrying electrodes available externally. The number of parallel transistors incorporated to from a single high power transistor depends upon the desired current carrying capabilities but in many instances may be a relatively large number. Even though the parallel transistors are connected internally to reduce lead length and capacitance, there is still some parasitic capacitance and lead resistance. FIG. 2 illustrates an equivalent circuit 49 for the parasitic components existing at control electrode 16 or 22. In the equivalent circuit 49 illustrated in FIG. 2, an external connection 0 is provided at one corner thereof and a second external connection 52 is provided at a diagonally opposite corner thereof.

It has been found that there is a substantial period between the time that the first parallel transistors adjacent external connection 50 turn on and the time the final parallel transistors adjacent external connection 52 turn on in response to a positive signal applied to external connection 50. Because of this built-in delay in high power transistors, if the signal, supplied by inverter 38 and the signal sensed by inverter 40 are obtained from the same place on control electrode 16 there is still a chance that at least portions of both switching transistors 12 and 14 will be conducting simultaneously.

To overcome this problem the present invention has the feature of providing a control terminal, external connection 50, and a detecting terminal, external connection 52, at the control electrode of each high power transistor. The output of inverter 38 is connected to the control terminal (50) and the input of inverter 40 is connected to the sense terminal (52). The input and output of inverters 42 and 44 are similarly connected to control electrode 22 of transistor 14. Thus, the control input signal for the transistor is applied to at least a first parallel transistor and the status of the transistor is sensed by at least a second parallel transistor spaced from the first parallel transistor a sufficient distance to ensure the complete operation of the high power transistor before a sense signal is supplied. In this specific embodiment the entire switching circuit is integrated onto a single semiconductor chip and the inverters 38, 40, 42 and 44 are connected to transistors 12 and 14 internally to further reduce the influence of parasitic components.

Figure 3:
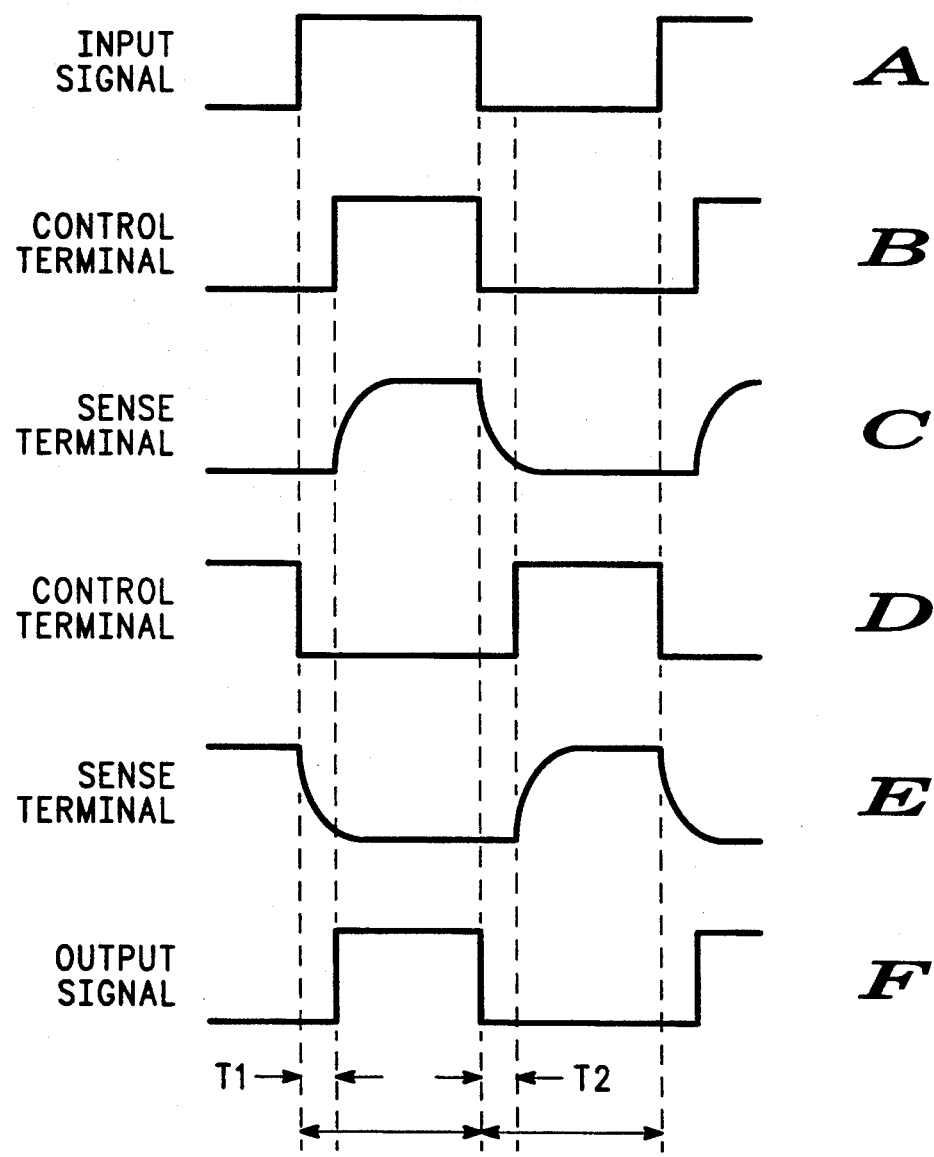
FIG. 3 illustrates waveforms available at various points in FIG. 1 and the timing relationship therebetween.

Referring to FIG. 3, waveform A represents the control signal supplied to input terminal 34 and, as described above, is a square wave with approximately a 50% duty cycle although virtually any type of control signal might be utilized. Waveform B is the control signal supplied by NAND gate 30 through inverter 38 to the control terminal (50) of control electrode 16 and waveform C is the sense signal supplied to inverter 40 from the sense terminal (52) of control electrode 16. Waveform D is the control signal supplied by NAND gate 32 through inverter 44 to the control terminal of control electrode 22 and waveform E is the sense signal available at the sense terminal of control electrode 22. Waveform F is the output signal available at output terminal 28.

When the control signal (waveform A) applied to NAND gate 30 goes positive the inverted signal applied to NAND gate 32 goes negative. Since at least one of the inputs to NAND gate 32 is negative, a positive output is available immediately without waiting for the second input. The positive output of NAND gate 32 is inverted by inverter 44 (waveform D) and applied to the control terminal of control electrode 22, which begins to turn transistor 14 off. The negative control signal propagates through the parasitic components of control electrode 22 and at a time T1 has completely turned transistor 14 off. Also, at time T1 the sense signal reaches the switching amplitude at the sense terminal (waveform E) and is applied through inverter 42 to the second input of NAND gate 30. With both inputs positive, NAND gate 30 provides a negative output which is inverted by inverter 38 (waveform B). The positive control signal applied to the control terminal (50) of control electrode 16 turns transistor 12 on, which provides an output signal at output terminal 28. When the input signal switches negative the above procedure is reversed.

Thus, a high power switching circuit is disclosed which utilizes logic gates to switch high power transistors positively so that there is no danger of a series circuit being formed. Further, the second transistor in a pair of series connected high power transistors is not switched on until the first transistor is switched completely off so that a series circuit can not be completed. The present circuit does not use external components to develop a delay and, thus, timing can be reduced to a minimum. Further, the circuit is simple and can be easily integrated into a single semiconductor chip.

While we have shown and described a specific embodiment of this invention, further modifications and improvements will occur to those skilled in the art. We desire it to be understood, therefore, that this invention is not limited to the particular forms shown and we intend in the appended claims to cover all modifications that do not depart from the spirit and scope of this invention.

What we claim is:

1. In a high power switching circuit including two switching transistors, each including a plurality of transistors connected in parallel and having a control electrode and two current carrying electrodes, with the current carrying electrodes connected in series, a control circuit for alternately turning the two switching transistors ON comprising:

first and second gates each having two input terminals and an output terminal;

control signal input circuitry including an in-phase connection to one input terminal of said first gate and an inverted connection to one input terminal of said second gate; and connecting means connecting a first point on the control electrode of one of the switching transistors to the output terminal of said first gate and a second spaced apart point on the control electrode of the one transistor to another input terminal of said second gate and connecting a first point on the control electrode of the other of the switching transistors to the output terminal of said second gate and a second spaced apart point on the control electrode of the other of the switching transistors to another input terminal of said first gate for turning on one of the switching transistors only after the other switching transistor is turned off.

2. A control circuit as claimed in claim 1 wherein the switching transistors and the control circuit are integrated into a single semiconductor chip.

3. A control circuit as claimed in claim 1 wherein the first and second gates are logic gates.

4. A control circuit as claimed in claim 3 wherein the logic gates are NAND gates and the output terminal of each NAND gate is connected to the first point on the control electrode of an switching transistor by an inverter and the second point on the control electrode of each switching transistor is connected to an input terminal of a NAND gate by an inverter.

5. A method of manufacturing a power switching circuit comprising the steps of:
  providing first and second switching transistors each having a control electrode and two current carrying electrodes, each of said switching transistors including a plurality of transistors formed in a single semiconductor substrate and connected in parallel to the control electrode and current carrying electrodes, the current carrying electrodes of said first and second switching transistors being connected in series;
  providing within each of the control electrodes of each of said switching transistors a control terminal connected to a first of said plurality of transistors and a detecting terminal connected to a second of said plurality of transistors;
  providing a control circuit; and
  connecting the control circuit to the control and detecting terminals of each of said switching transistors for turning on one of the switching transistors, in response to a control signal input, only after the other switching transistor is turned off.

6. A method as claimed in claim 5 wherein the control and detecting terminals are positioned so that an output signal is available on the detecting terminal in response to a control signal on the control terminal only after all transistors in the plurality of transistors have reacted to the control signal.

7. A method as claimed in claim 5 wherein the first and second switching transistors and the control circuit are provided on a single integrated circuit.

8. A method as claimed in claim 5 wherein the step of providing the control circuit includes providing a control circuit with a control signal input, two oppositely phased control signal outputs and two detection signal inputs and the connecting step includes connecting the control signal outputs, one each, to the control terminals of the control electrodes of said switching transistors and connecting the detection signal inputs of the control circuit to opposite ones of the detecting terminals of said switching transistors.

9. A power switching circuit comprising:
  first and second MOS switching transistors each having a control electrode and two current carrying electrodes, each of said MOS switching transistors including a plurality of transistors formed in a single semiconductor substrate and connected in parallel to the control electrode and current carrying electrodes, the current carrying electrodes of said first and second MOS switching transistors being connected in series, each of the MOS switching transistors further including parasitic components which combine with the parasitic components of the remaining transistors in the plurality of transistors to form a parasitic circuit as the control electrode; and
  a control circuit including first and second gates each having two input terminals and an output terminal, control signal input circuitry including an in-phase control signal connection to one input terminal of said first gate and an inverted control signal connection to one input terminal of said second gate, and connecting means connecting a first point in the parasitic circuit of the control electrode of said first MOS switching transistor to the output terminal of said first gate and a second point in the parasitic circuit of the control electrode of said first MOS transistor to another input terminal of said second gate and connecting a first point in the parasitic circuit of the control electrode of said second MOS switching transistor to the output terminal of said second gate and a second point in the parasitic circuit of the control electrode of said second MOS transistor to another input terminal of said first gate, the first and second points in the parasitic circuit of each of the MOS switching transistors being spaced apart within the parasitic circuit for turning on one of said first and second switching transistors only after the other of said first and second switching transistors is turned off.

10. A power switching circuit comprising:
  first and second MOS switching transistors each having a control electrode and two current carrying electrodes, each of said MOS switching transistors including a plurality of transistors formed in a single semiconductor substrate and connected in parallel to the control electrode and current carrying electrodes, the current carrying electrodes of said first and second MOS switching transistors being connected in series; and
  a control circuit including first and second gates each having two input terminals and an output terminal, control signal input circuitry including an in-phase control signal connection to one input terminal of said first gate and an inverted control signal connection to one input terminal of said second gate, and connecting means connecting the control electrode of said first MOS switching transistor to the output terminal of said first gate and to another input terminal of said second gate and connecting the control electrode of said second MOS switching transistor to the output terminal of said second gate and to another input terminal of said first gate, the connecting means connecting the control electrode of each of the MOS switching transistors to the output terminal of a gate and to the input terminal of the other gate being connected to two different transistors in the plurality of transistors included in each of the MOS switching transistors for turning on one of said first and second switching transistors only after the other of said first and second switching transistors is turned off.

* * * * *